United States Patent
Fontaine (10) Patent No.: US 6,563,448 B1
(45) Date of Patent: May 13, 2003

(54) FLEXIBLE SAMPLE RATE CONVERTER FOR MULTIMEDIA DIGITAL-TO-ANALOG CONVERSION IN A WIRELESS TELEPHONE

(75) Inventor: Paul H. Fontaine, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/135,354

(22) Filed: Apr. 29, 2002

(51) Int. Cl.⁷ ............................................... H03M 3/00
(52) U.S. Cl. ....................................... 341/143; 341/144
(58) Field of Search ................................ 341/143, 144, 341/145, 118, 120, 61

(56) References Cited

U.S. PATENT DOCUMENTS

| | | |
|---|---|---|
| 3,706,944 A | 12/1972 | Tewksbury |
| 4,467,291 A | 8/1984 | Roza |
| 4,772,871 A | 9/1988 | Suzuki et al. |
| 4,965,531 A * | 10/1990 | Riley .......................... 331/1 A |
| 5,055,843 A | 10/1991 | Ferguson, Jr. et al. |
| 5,497,152 A * | 3/1996 | Wilson et al. ................. 341/61 |
| 5,600,320 A * | 2/1997 | Wilson et al. ............... 341/144 |
| 5,625,359 A | 4/1997 | Wilson et al. |
| 5,892,468 A | 4/1999 | Wilson et al. |
| 5,963,160 A | 10/1999 | Wilson et al. |
| 6,215,423 B1 * | 4/2001 | May et al. .................... 341/61 |
| 6,275,177 B1 | 8/2001 | Ho et al. |

OTHER PUBLICATIONS

Naus, et al. A CMOS Stereo 16–bit D/A Converter for Digital Audio, *J. Solid State Circ.* (IEEE, 1987), pp. 390–395.

Kwan, et al., "A Stereo Multibit SD DAC with Asynchronous Master–Clock Interface", *J. Solid State Circ.*, vol. 31, No. 12 (IEEE, 1996), pp. 1881–1887.

* cited by examiner

*Primary Examiner*—Brian Young
*Assistant Examiner*—John Nguyen
(74) *Attorney, Agent, or Firm*—Ronald O. Neerings; Wade James Brady, III; Frederick J. Telecky, Jr.

(57) ABSTRACT

A wireless telephone (40) is disclosed, in which audio input/output circuitry (44) includes a digital-to-analog conversion function (50) for producing an analog output signal (s(t)) based upon a digital baseband signal (S) from a digital signal processor (42). The digital-to-analog conversion function (50) includes first and second $\Sigma\Delta$ modulators (46, 48), each of which are controlled by a sampling clock generated by a dual frequency divider (47) controlled by the first $\Sigma\Delta$ modulator (46). A sampling latch (49) samples the digital baseband signal synchronously with the sampling clock. The second $\Sigma\Delta$ modulator (48) selects an oversampling multiple that is applied to a digit filter (52) along with the sampled signal from the sampling latch (49). The digital filter (52) reconstructs a digital signal from the sampled value and the oversampling multiple that is the equivalent of that reconstructed by the decimation of an over sampled signal. The reconstructed signal is converted to analog by a digital-to-analog converter (56). However, the digital filter (52) and DAC (56) can operate at a much lower frequency than in conventional circuits, thus providing excellent noise performance without requiring high frequency clocking.

23 Claims, 7 Drawing Sheets

FIG. 9d
(PRIOR ART)
out(n)

FLEXIBLE SAMPLE RATE CONVERTER FOR MULTIMEDIA DIGITAL-TO-ANALOG CONVERSION IN A WIRELESS TELEPHONE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of wireless telephony, and is more specifically directed to audio output from multiple digital sources by way of a wireless telephone handset.

As is well-known in the art, digital modulation techniques have greatly improved the audio fidelity and transmission range of wireless telephones, while also significantly reducing the cost of service. Of course, the digital wireless telephone must demodulate and decode the incoming digital signal, and convert it into analog form to drive the audio speaker with a conventional audio signal. Accordingly, modem wireless telephones include a digital-to-analog converter (DAC) for performing this function.

A well-known DAC architecture is referred to as the oversampling $\Sigma\Delta$ ("sigma-delta") DAC. A fundamental example of the oversampling $\Sigma\Delta$ DAC is described in Naus et al., "A CMOS Stereo 16-bit D/A Converter for Digital Audio," *Journal of Solid-State Circuits*, VO. SC-22, No. 3 (IEEE, June 1987), pp. 390–395. According to this approach, the incoming digital data stream is oversampled by a significant multiple (e.g., 256 times the CD sample data rate of 44.1 kHz), and modulated into a one-bit data stream by a sigma-delta modulator. This one-bit data stream is applied to a 1-bit DAC that modulates a DC voltage with the one bit data stream to produce the output analog signal. In conventional DACs of this type, the sigma-delta modulator and the 1-bit DAC each operate at the oversampling clock frequency (e.g., 256 times the sample data rate, or about 11 MHz). This clock is conventionally generated by a phase-locked loop (PLL), based upon a system clock within the wireless telephone itself. As known in the art, phase locked-loop (PLL) circuits are used to generate stable clock signals at a fixed frequency relationship, generally a ratio of integers, relative to a reference clock. The frequency relationship is effected by a frequency divider applied to the reference clock and in the PLL feedback loop. In wireless telephones, the reference clock is typically the wireless clock frequency for the particular wireless transmission mode.

Modern advanced mobile computing devices and wireless telephone handsets are evolving from the so-called second generation (2G) technologies for wireless communications toward the capability of providing the so-called third generation (3G) wireless services. These 3G services are expected to extend current second generation voice and data services, and to include new very high bandwidth entertainment services including video and CD quality audio, interactive messaging including video and graphics, videoconferencing, video streaming, and remote control and monitoring services. These high-bandwidth services and applications of course place significant pressure on the wireless hardware, especially in receiving and outputting this multimedia content.

The digital signals from these various sources and transmission modes are at a wide range of data rates and frequencies. For example, digital audio tape (DAT) operates at a 48 kHz data rate, while compact disk (CD) audio is at a 44.1 kHz data rate. Other commonly encountered digital data rates include 32 kHz, 24 kHz, 22.05 kHz, 16 kHz, 12 kHz, 11.025 kHz, and 8 kHz. The advanced multi-purpose wireless telephone must therefore be able to perform digital-to-analog conversion of the incoming digital signals from each of these multiple signal sources, at each of these digital data rates, to provide a high-fidelity analog stereo audio output. However, the ability to convert data from any and all of these available data rates greatly complicates the architecture of the sigma-delta DAC.

Figure 1:
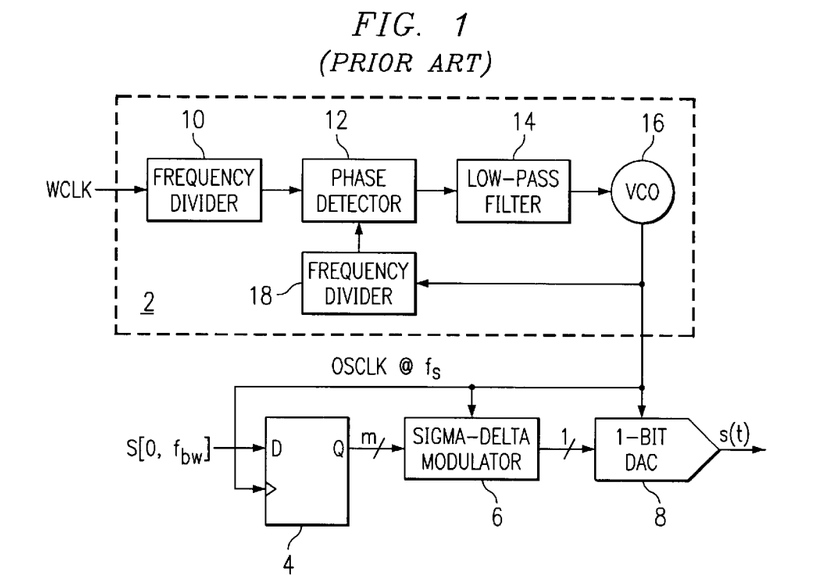
FIG. 1. is an electrical diagram, in block form, of a digital-to-analog converter (DAC) according to the prior art.

By way of further explanation, FIG. 1 illustrates a conventional arrangement of a sigma-delta DAC using a PLL-based clock. Incoming baseband digital signal S, having a bandwidth $f_{bw}$, is sampled by latch 4, which is clocked at an oversampling frequency $f_S$ applied by clock signal OSCLK from phase-locked loop (PLL) 2. Oversampling frequency $f_S$ is a frequency that is generally a large integral multiple of the signal bandwidth $f_{bw}$. While the Nyquist criterion requires sampling of a signal at twice its bandwidth in order to accurately recover the signal, oversampling frequency $f_S$ is typically much greater than twice the bandwidth $f_{bw}$. For example, a typical oversampling multiple is 256. In the case of a signal bandwidth $f_{bw}$ of about 40 kHz, the oversampling frequency $f_S$ is on the order of 10 MHz or higher.

PLL 2 is constructed in the conventional manner, and as such includes input frequency divider 10 for generating a reference clock signal based upon wireless clock WCLK. Frequency divider 10 presents the reference clock to one input of phase detector 12, which receives a feedback signal at its other input. Phase detector 12 produces an analog output signal based on the difference in phase between the reference clock and the feedback signal. This phase difference signal is filtered for stability by low-pass filter 14, and is applied to the control input of voltage controlled oscillator (VCO) 16. VCO 16 produces the output oversampling clock OSCLK, which is fed back through frequency divider 18 to the second input of phase detector 12. The oversampling clock OSCLK is thus locked to wireless clock WCLK, at a frequency multiple determined by the divisor ratio of frequency dividers 18, 10.

The oversampling clock OSCLK is applied to sampling latch 4, as noted above. Oversampling clock OSCLK also controls the modulation of sigma-delta modulator 6, which modulates the m bits of the sampled input signal S to a single-bit signal, in this example. 1-bit DAC 8, which is also clocked by oversampling clock OSCLK, receives the modulated output from modulator 6, and produces output analog signal s(t).

While the arrangement of FIG. 1 is well suited for generating an oversampling clock OSCLK at a reasonable multiple of wireless clock WCLK, this task becomes exceedingly difficult if signals of varying frequency are to be processed by this circuit. This is because there is no small set of integers that can be used in PLL 2 to produce the desired oversampling clock OSCLK at all of the necessary audio standard frequencies.

In addition to the differences in data rates of the various signal sources, multiple broadband communications standards are now in place. Indeed, the 3G communications standard itself ("IMT-2000") defines a family of radio interfaces that are suitable for a wide range of environments. Furthermore, some wireless communications standards are extensions of 2G modulation techniques, extending the data rates of 2G standards toward the levels required for 3G communications. To further complicate this field, different regions of the world have gravitated toward different wireless communications technologies. Unfortunately, these various standards operate at different clock rates. For example, the wireless clock (WCLK in FIG. 1) for EDGE transmission is 26 MHz, the GSM clock is 13 MHz, the WCDMA clock is at 15.36 MHz, D-AMPS operates at 19.44 MHz, PDC operates at one of 12.6/12.8/14.4/16.8 MHz, PHS at 16.8 or 8.4 MHz, and AMPS operates at 14.4/15.36/16.8 MHz.

Because of the varying incoming signal sample rates and the wide number of possible wireless transmission modes, a set of ratios of relatively small integers of the various wireless- clock frequencies cannot be derived, for use in a conventional PLL, to produce the wide range of oversampling clock frequencies necessary for D/A conversion in all combinations.

Figure 2:
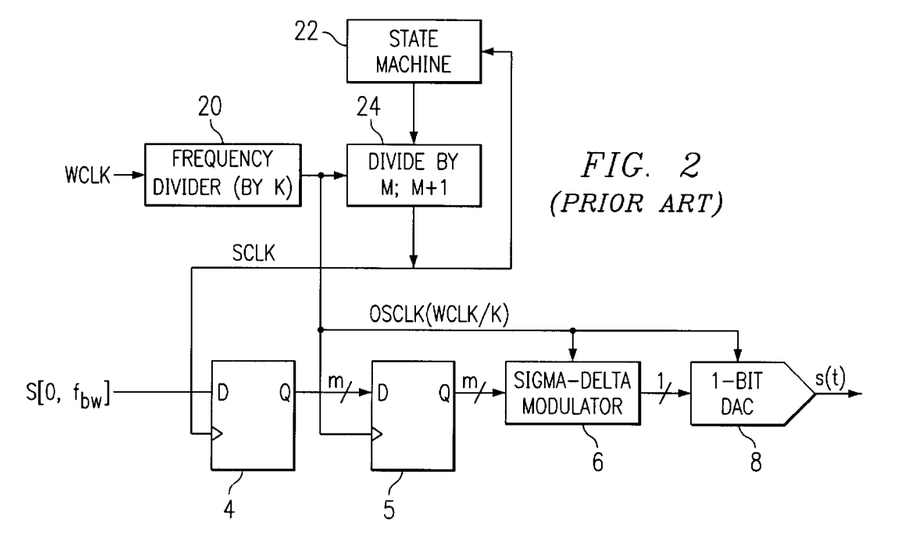
FIG. 2 is an electrical diagram, in block form, of another DAC according to the prior art.

By way of further background, another type of known oversampled DAC does not require the generation of clock frequencies at an exact multiple of the input sample rate. An example of a DAC of this type is illustrated in FIG. 2, in which digital signal S is sampled by latch 4, oversampled by latch 5, modulated by sigma-delta modulator 6, and converted into the analog domain by DAC 8. Latch 5, modulator 6, and DAC 8 are clocked by oversampling clock OSCLK, which is at a frequency based on wireless clock WCLK. This oversampling clock signal OSCLK is divided down from wireless clock WCLK by frequency divider 20 so that the design of DAC 8 and other circuitry may be kept relatively modest. For example, if wireless clock WCLK is at a frequency of 13 MHz, oversampling clock OSCLK may be divided down from wireless clock WCLK by a factor of five, so that DAC 8 and the other circuitry can operate at the more modest frequency of 2.6 MHz.

Sampling latch 4 is controlled by clock SCLK, which is generated by frequency divider 24 under the control of state machine 22. Dual frequency divider 24 divides oversampling clock OSCLK by either integer divisor M or by the next incremental integer divisor M+1, depending upon a control signal issued by state machine 22. Alternatively, dual divider 24 may receive wireless clock WCLK at its input, and divide its frequency down directly. According to this construction, state machine 22 controls the number of times that dual divider 24 divides the frequency of its incoming clock by the integers M, M+1 so that, on the average, sample clock SCLK has a frequency that is a desired oversampling multiple of the Nyquist frequency 2 $f_{bw}$. For example, if wireless clock WCLK has a frequency of 13 MHz and frequency divider 20 divides this clock signal down by a factor of five to producing oversampling clock OSCLK at 2.6 MHz, and if input signal S has a bandwidth of 22.05 kHz and thus a sample rate of 44.1 kHz, sampling clock SCLK at an average frequency of 44.1 kHz can be generated by dividing oversampling clock OSCLK by a ratio of 26000/441, which is expressed in simplest terms. While these integers are too large to be reasonably implemented in a PLL, this frequency division is accomplished in the conventional circuit of FIG. 2 by state machine 22 controlling frequency divider 24 to divide oversampling clock OSCLK by a factor of 59 (M30) approximately 96% of the time, and by a factor of 58 (M) approximately 4% of the time. Over time, the average frequency of sampling clock SCLK approaches 44.1 kHz, which is the audio sample rate of signal S.

Latch 5 then oversamples the sampled output of latch 4, at the higher oversampling rate of oversampling clock OSCLK itself. In the example given above, latch 5 will sample 96% of the samples taken by latch 4 59 times, and will sample 4% of these samples 58 times. The oversampled output is then applied to modulator 6 and DAC 8, which provide the analog output under the control of the oversampling clock OSCLK.

While the approach of FIG. 2 is able to oversample an input signal of arbitrary frequency at any desired ratio, on the average, the unavoidable jitter between the M and M+1 samples of the input signal produces spurious signals in the audio band. This audio noise undesirably affects the output analog signal. In addition, even with frequency division applied by frequency divider 20, 1 bit DAC 8 must be designed to operate at a relatively highfrequency, which involves substantial design constraints and significant power dissipation.

Figure 3:
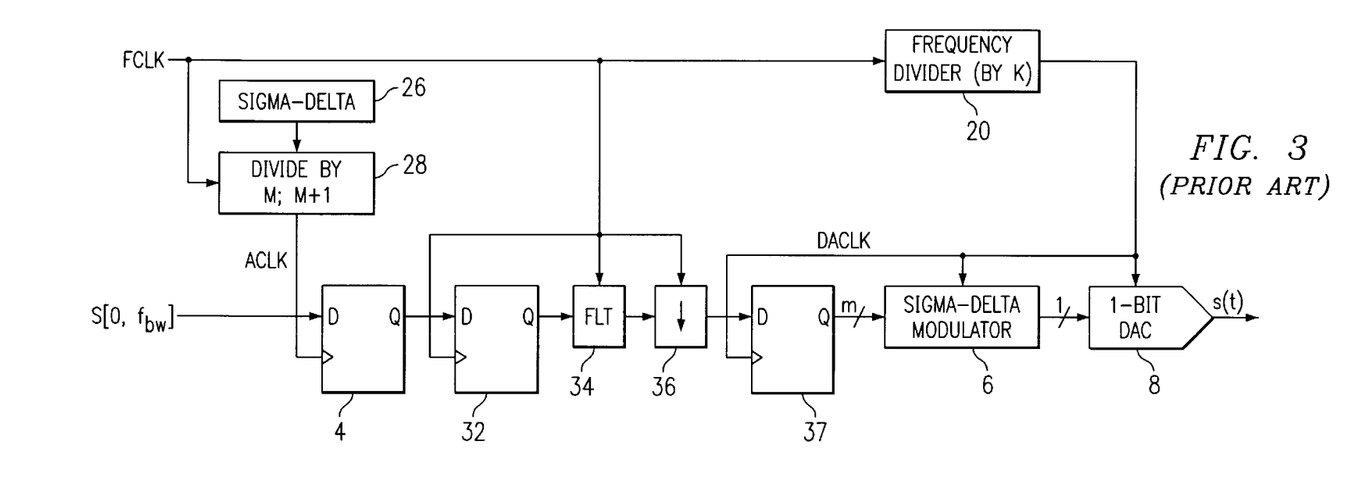
FIG. 3 is an electrical diagram, in block form, of yet another DAC according to the prior art.

According to another known approach, an example of which is shown in FIG. 3, the extent of the spurious noise can be minimized by increasing the number of samples per input sample, so that relative time differences between the M and M+1 samples are minimized. As described in Kwan et al., "A Stereo Multibit ΣΔ DAC with Asynchronous Master-Clock Interface", *Journal of Solid-State Circuits*, Vol. 31, No. 12 (IEEE, December 1996), pp. 1881–1887, audio noise due to jitter in the oversampling is reduced by driving the DAC with a low-jitter clock that is independent from the PLL clock used to oversample and interpolate the input signal.

In the example of FIG. 3, a very high frequency clock signal FCLK, for example on the order of 50 MHz, is received at the input of dual divider 28. As in the previous examples, dual divider 28 is controlled by sigma-delta modulator 26 to divide down clock signal FCLK by integers M, M+1, and generate a resampling clock ACLK. According to this circuit, the desired frequency of resampling clock ACLK is, on the average, equal to that of the sample rate of incoming signal S; accordingly, the relative fractions of the cycles that are divided by integers M and M+1 are controlled, by sigma-delta modulator 26, to produce this average frequency. As a result, a sample rate of the input signal is twice the bandwidth of the signal (2 $f_{bw}$) is related to the frequency $f_F$ by:

$$2f_{bw} = \frac{f_F}{M(1+\alpha)}$$

where α is the relative fraction of the samples that are oversampled at the frequency of FCLK divided by M+1. Because the frequency of very high frequency clock FCLK is much higher than that of the wireless and oversampling clocks in the previous conventional circuits, the spurious noise in the audio band is greatly reduced in the circuit of FIG. 3. For example, for very high frequency clock FCLK at a frequency of on the order of 50 MHz, the audio noise is very low for input signal S at the CD rate of 44.11 kHz. This of course requires relatively large divisor values M, M+1, for example 1133 and 1134, respectively, for FCLK at 50 MHz.

Resampling clock ACLK, at an average frequency equal to the input sample rate (e.g., 44.1 kHz), is applied to the clock input of latch 4, which samples signal S and applies the sample values to the input of oversampling latch 32. Oversampling latch 32 is clocked by very high frequency clock signal FCLK, and oversamples the sampled output of latch 4. As noted above for the values of M, M+1, the oversampling performed by latch 32 provides a large number of oversample values for each sample of the input signal (i.e., 1133 or 1134). The oversampled output of latch 32 is then filtered by digital filter 34, which is a conventional sinc (sinx/x) filter for eliminating power at the multiples of the frequency at which D/A conversion is performed downstream, in the conventional manner. Decimating filter 36 then decimates the filtered oversampled sequence, in the conventional manner, by a multiple K with which clock DACLK is divided down from very high frequency clock FCLK. The decimated digital datastream is then applied to second sampling latch 37, which samples the decimated filtered oversampled signal, at clock rate DACLK which is divided down from very high frequency clock FCLK by a factor K, performed by frequency divider 20. The samples from switch 37 are then applied to sigma-delta modulator 6, and in turn to 1-bit DAC 8, as before. In this example of FIG. 3, latch 4, modulator 6, and DAC 8 are all clocked by a relatively high speed clock DACLK, which is at a frequency divided down from clock FCLK to on the order of 3 MHz or so by frequency divider 20. DAC 8 then outputs the analog signal s(t).

As noted above, the noise performance of the circuit of FIG. 3 is quite good, considering that the difference in the number of samples is quite small when the oversampling multiple is as large as one thousand or greater, as in this example. However, the circuit of FIG. 3 requires the generation and use of an extremely high frequency clock FCLK, for example on the order of 50 MHz. The clock circuitry for generating this clock, and the circuits utilizing this clock (divider 28, oversampling latch 34, filters 34, 36, etc.), are necessarily more complex when operating at such high frequencies. In addition, the power dissipated also increases with increasing operating frequency, which is of great concern in battery-powered systems such as wireless telephones. Accordingly, the solution provided by the circuit of FIG. 3 is somewhat unattractive even if the very high frequency clock FCLK is available, which in many systems it is not.

BRIEF SUMMARY OF THE INVENTION

It is therefore an object of this invention to provide a digital-to-audio converter that provides high fidelity oversampling of the input digital data stream without actually generating and using high frequency clock signals.

It is a further object of this invention to provide such a converter that is capable of converting digital data at one of a multiple of sample frequencies.

It is a further object of this invention to provide such a converter in which a wide range of wireless clocks may be used in the conversion.

It is a further object of this invention to provide such a converter that is suitable for digital implementation in a battery-powered device such as a wireless telephone.

Other objects and advantages of the present invention will be apparent to those of ordinary skill in the art having reference to the following specification together with its drawings.

The present invention may be implemented into an audio circuit for converting a digital baseband signal into an analog output. The circuit includes a first sigma-delta circuit that controls a dual frequency divider. The dual divider divides a system clock, such as in a wireless telephone, by successive integers, under the control of a first sigma-delta circuit. An output clock is generated by the dual divider to sample the incoming baseband signal at near its Nyquist frequency. The output of the dual divider is also applied, as a clock, to a second sigma-delta circuit that determines the number of oversamples to be associated with each baseband sample. This number of samples and the Nyquist-sampled baseband signal are applied to a digital filter. The digital filter synthesizes a filtered version of an oversampled output signal based on these inputs, and the synthesized output signal is converted to analog.

DETAILED DESCRIPTION OF THE INVENTION

The present invention will be described in connection with an example of its implementation in a wireless handset. It is contemplated that this invention is particularly well-suited for use in such an application. However, it is also contemplated that this invention will be of similar benefit in many other applications, particularly those involving multi-mode wireless communication, or receiving audio signals from a variety of digital sources. Examples of such other applications include mobile audio players, mobile computing devices, and the like. It is therefore to be understood that these and other alternatives to the embodiments described below are contemplated to be within the scope of the invention as claimed.

Figure 4:
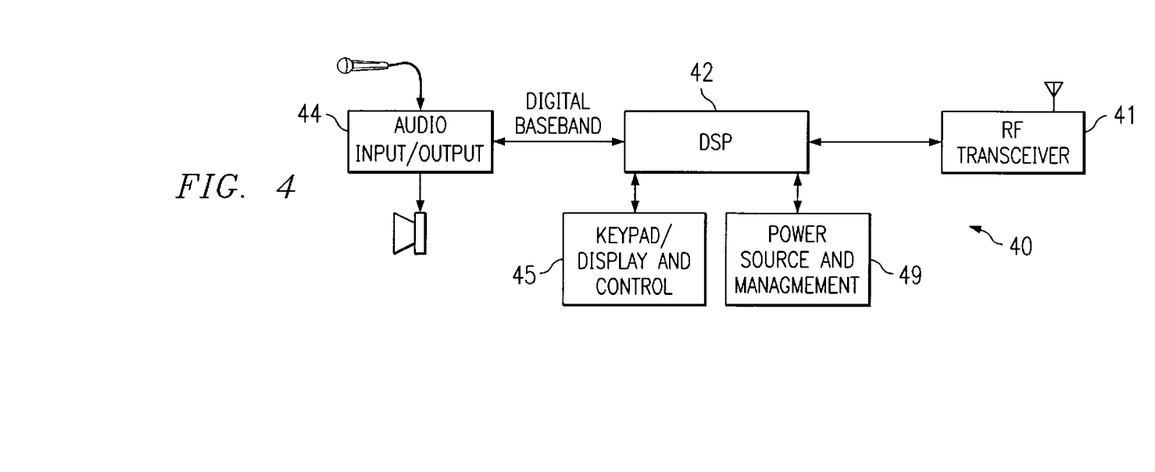
FIG. 4 is an electrical diagram, in block form, of a wireless telephone including the preferred embodiment of the invention.

FIG. 4 illustrates, in block form, the construction of wireless telephone 40 according, to an exemplary implementation of the preferred embodiment of the invention. As shown in FIG. 4, radio frequency. (RF) transceiver 41 is coupled to an antenna, and is responsible for the transmission and receipt of RF signals to and from the wireless communications network. Digital signal processor (DSP) 42 is coupled to RF transceiver 41, and performs digital signal processing upon the signals to be transmitted and upon, those that are received, in the known manner. For example, DSP 42 includes a digital codec (code/decode), and digital signal processing functionality for modulating and demodulating the coded signals into and from a modulation scheme such as quadrature amplitude modulation (QAM) or another, known phase and amplitude modulation scheme. DSP 42 may be implemented as a conventional digital signal processor available in the art, for example a member of the TMS320c5x or TMS320c6x families, of digital signal processors available from Texas Instruments Incorporated, having sufficient capability for carrying out the necessary digital operations in handset 10. DSP 42 may also perform a significant amount of digital filtering of the baseband digital data signals.

Wireless telephone 40 also includes the capability of input and output via keyboard/display and control function 45, particularly in the case of 3G wireless services, in which the payload signals may also include higher complexity signals such as computer and video data. Wireless telephone 40 also includes power source and management function 49, which may include such functions as an integrated power supplies, low dropout voltage regulators, power supply voltage supervision, battery and temperature monitoring and the like.

Wireless telephone 40 also includes audio input/output circuit 44, which is responsible for receiving analog audio input from microphone MIC, converting the input signal into a digital baseband data stream, for coding and modulation by DSP 42, and for eventual transmission by RF circuitry 41. Conversely, audio input/output circuit 44 receives a digital baseband signal or data stream from DSP 42, corresponding to a wireless signal received and processed by RF transceiver 47 and DSP 41, and converts this digital baseband signal into an analog audio output signal for output via speaker SPK. Of course, other input and output devices may alternatively be served by audio input/output circuit 44, such devices including a headset and associate microphone, a speakerphone module, recording media, and the like.

Figure 5:
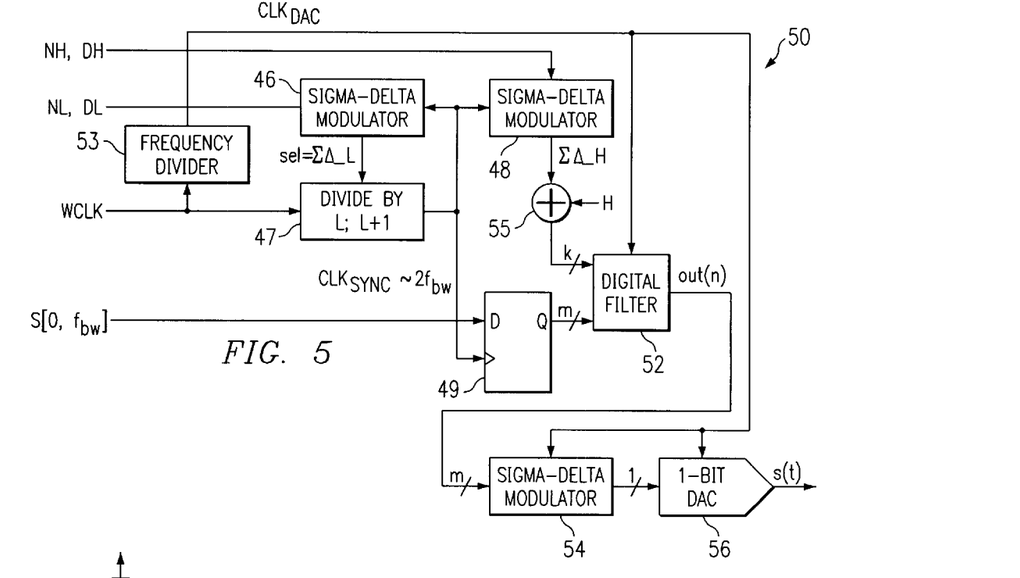
FIG. 5 is an electrical diagram, in block form, of a digital-to-analog, converter (DAC) according to the preferred embodiment of the invention.

Referring now to FIG. 5, the construction of digital-to-analog converter (DAC) 50 according to the preferred embodiment of the invention will now be described. According to this embodiment of the invention, DAC 50 is implemented as part of audio input/output circuit 44 in wireless telephone 40. Of course, other locations and arrangements of DAC 50, depending upon the architecture of the specific system (e.g., wireless telephone), are also contemplated.

DAC 50 receives digital baseband signal S from DSP 42. Signal S has an information bandwidth of $f_{bw}$, and is applied to sampling latch 49. This signal S may be inherently band-limited by its source, or may also be low-pass filtered into bandwidth $f_{bw}$ by a conventional digital low-pass filter to remove images. According to this embodiment of the invention, sampling latch 49 is controlled by sample clock $CLK_{SYNC}$, which, on the average, is equal to the Nyquist sampling rate of 2 $f_{bw}$, as generated by dual divider 47 under the control of first ΣΔ modulator 46. However, the sampled data signal from latch 49 need not be resampled at a higher rate according to this embodiment of the invention, and is instead directly applied to digital filter 52.

In this embodiment of the invention, dual divider 47 receives wireless clock WCLK at its input, and divides the frequency of clock WCLK by one of integers L, L+1, as determined by first ΣΔ modulator 46, to produce clock signal $CLK_{SYNC}$. Alternatively, divider 47 may divide the frequency of clock WCLK by a selected one of more than two integers (e.g., L, L+1, L+2), if this additional control is desired; however, the use of two integers L, L+1 provides minimum jitter. It is contemplated that wireless clock WCLK is the system clock of wireless telephone 40, and as such is contemplated to have a frequency on the order of 13 MHz or less.

First ΣΔ modulator 46 is constructed according to conventional techniques. Many arrangements of ΣΔ modulators are well known in the art. In general, modulator 46 may include one or more integrators, depending upon the desired order of the modulation, by way of which the difference between a feedback value and an input value is integrated and quantized to produce the output signal. In effect, first ΣΔ modulator 46, in this embodiment of the invention, iteratively compares a feedback value to a reference value, and the difference is integrated. The integral value is quantized to produce a signal indicating whether the integral is above or below the quantization threshold. This signal is applied to dual divider 47, to control whether it divides wireless clock WCLK; by the integer L or the integer L+1. For example, beginning from a first state (e.g., generating a "0" output, causing dual divider 47 to divide by L) in which the integral is below the quantization threshold, a positive difference may be applied to the integral, causing the value of the integral to increase to the quantization threshold, at which point the output changes state (e.g., to "1", causing dual divider to divide by L+1); The change in output state then provides a negative difference value to the integral which, over a number of cycles, causes the value of integral to fall below the quanization threshold, changing the state of the output back to "0". The value of the quantization threshold is determined by the input signals NL, DL, which correspond to the numerator and denominator, respectively, of a fractional value between L and L+1 to which, upon addition to integer L, the average frequency division performed by dual divider 47 should converge. In other words, the frequency division performed by dual divider 47 should, on the average, converge on a divisor of $$L + \frac{NL}{DL}.$$

As a result, the sampling frequency $f_{SYNC}$ is related to the frequency $f_{WCLK}$ of wireless clock WCLK by:

$$f_{SYNC} = \frac{1}{L + \frac{NL}{DL}} f_{WCLK}$$

First ΣΔ modulator 46 thus sets the average frequency of sample clock $CLK_{SYNC}$ by determining the average time that dual divider 47 divides by the adjacent integers L, L+1.

As shown in FIG. 5, the sampled output of digital signal S is applied to digital filter 52 as a digital word of m bits in width. This sampled signal is not oversampled, as in conventional ΣΔ sample rate converters, but rather is simply a single instance of the particular sample value.

Second ΣΔ modulator 48 is also provided in DAC 50. This second ΣΔ modulator 48 is preferably constructed similarly as first ΣΔ modulator 46, and produces a single bit binary output that is applied to adder 55. Second ΣΔ modulator 48 is clocked by clock signal $CLK_{SYNC}$, as is first ΣΔ modulator 46. The second input to adder 55 is a base oversampling value H, to which either "0" or "1" is added, depending. upon the current output of second ΣΔ modulator 48. The output of adder 55 is a digital word corresponding to a number of "virtual" oversamples for each sampled value of input signal S from latch 49. The average number of "virtual" oversamples will therefore be $$H + \frac{NH}{DH}.$$

Each sample of signal S from latch 49 is thus applied to digital filter 52 along with a virtual oversample value from adder 55.

The values NL, DL, NH, DH are preferably programmable values, for example stored in registers that are written under the control of DSP 42 (FIG. 4). In addition, the integer values L, H are also preferably programmable values, again under the control of DSP 42. As noted above, many possible sources of audio information are contemplated to be available to new-generation wireless telephones. These audio sources present their digital data at a number of frequencies, each of which must be processed by the audio circuitry. In addition, modern wireless telephones are expected to be capable of operating according to each of a number of wireless transmission standards, each of which require a system clock at a different frequency from the others. The programmability of the frequency divider ratios according to this embodiment of the invention permits this, wide range of audio input and wireless system frequencies to be processed, all without requiring the generation of extremely high frequency clocks in order to achieve high oversampling performance.

Figure 6A:
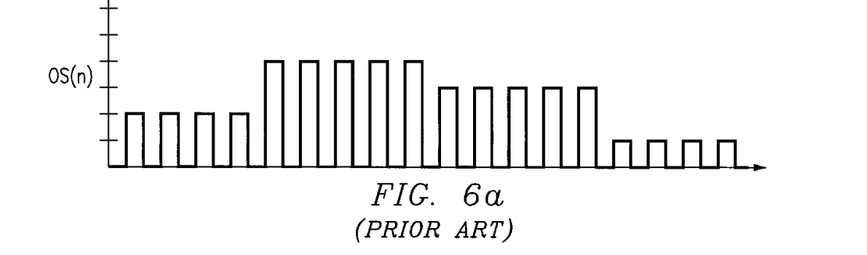
FIGS. 6a and 6b are timing diagrams illustrating the sampled input signal according to the prior art and according to the preferred embodiment of the invention, respectively.
Figure 6B:
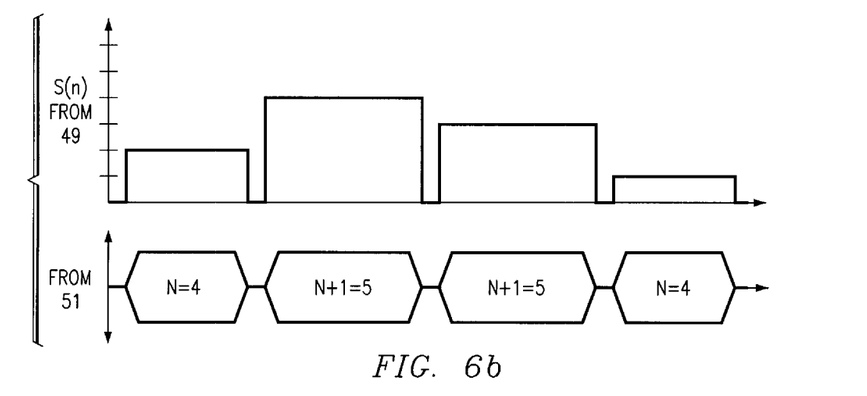

Digital filter 52 thus receives, from latch 49 and adder 55, sufficient information to perform the same filtering operation as it would if it received an oversampled input signal. In fact, the content of the information received by digital filter 52 is the same as that generated in a conventional oversampling DAC. The form of the information, however, that is provided by latch 49 and adder 55 is at a lower frequency than in the true oversampled DAC. FIGS. 6a and 6b illustrate these differences.

FIG. 6a illustrates an example of an oversampled signal OS(n). Signal OS(n) consists of a plurality of discrete values, and is oversampled in the sense that multiple samples represent each value. For example, the first four samples of signal OS(n) shown in FIG. 6a all have an amplitude of two, the next five samples all have an amplitude of four, the next five samples all have an amplitude of three, and the last four samples all have an amplitude of one. The samples of oversampled signal OS(n) are at a frequency, $f_{HF}$, that is much higher than the frequency, $f_S$, of the underlying signal itself. Oversampled signal OS(n) is derived from sampling the underlying signal at a higher frequency than the signal itself. In this example, oversampling frequency $f_{HF}$=4.5 $f_S$, on the average, since four samples are taken of half of the underlying signal values, and five samples are taken of the remainder. Typically, of course, the oversampling ratio will be much higher than 4.5:1, for example as high as 128:1.

FIG. 6b illustrates the sampled output of latch 49 and the corresponding output of adder 55, in representing oversampled signal OS(n) of FIG. 6a. The frequency of sampled signal S(n) from latch 49, which is at the Nyquist frequency of the incoming signal S(t), is much lower than the frequency $f_{HF}$ of the corresponding oversampled signal OS(n) shown in FIG. 6a. However, the number of oversamples that would have been present if oversampling were done at frequency $f_{HF}$ is provided as a digital value by adder 55, also at the frequency of sampled signal S(n). As shown in FIG. 6b, the first sample has an amplitude of two during such time as adder 55 presents a digital value H=4, corresponding to the number of oversamples of the corresponding portion of oversampled signal OS(n). The next value, of amplitude four, is associated with adder 55 presenting the value H+1=5, corresponding to the five oversamples for the corresponding portion of,oversampled signal OS(n). Signal S(n) and the corresponding adder 55 output continues for the remaining values in oversampled signal OS(n). In practice, the number of virtual samples (i.e., the data value from adder 55) do not align with the pulse width of the corresponding sample taken by switch 49, as the specific temporal location of the sample by switch 49 within the duration of the input sample is of no relevance to the end result. Rather, the virtual oversampling ratio $$H + \frac{NH}{DH}$$

need only correspond to an integer multiple of the ratio $$\frac{f_{DAC}}{2f_{bw}},$$

where $F_{DAC}$ is the frequency of clock $CLK_{DAC}$.

As evident from a comparison of FIGS. 6a and 6b, latch 49 and adder 55 present the same information to digital filter 52, as would a truly oversampled signal (such as signal OS(n) of FIG. 6a) at the high frequency $f_{HF}$. However, the operational frequency of the sampled signal from latch 49 and of the output of adder 55 is much lower than it would be for a true oversampled signal. Accordingly, the complexity of the circuitry used in digital filter 52 and elsewhere in DAC 50 can be relatively low, for a given level of accuracy and fidelity in the digital-to-analog conversion.

Digital filter 52 may be implemented by way of a digital signal processor (DSP) executing program code corresponding to the functions described in further detail below. Preferably, however, digital filter 52 is realized by way of custom logic for performing these functions, to achieve optimal performance. Referring back to FIG. 5, the output of digital filter 52 is an m-bit digital datastream, corresponding to the input digital baseband signal S, after sinc filtering and decimation performed by digital filter 52 upon the virtual oversampled input described above. This signal is applied to ΣΔ modulator 54, which is constructed according to conventional techniques to produce a lower resolution signal, based on its input from digital filter 52, in the conventional manner. While FIG. 5 shows a one-bit output from ΣΔ modulator 54, it is to be understood that the output of ΣΔ modulator 54 may alternatively be a multiple-bit output (e.g., a three-bit digital output), depending upon the resolution desired. The output of ΣΔ modulator 54 is then applied to DAC 56. In the example where the output of ΣΔ modulator 54 is a single bit, DAC 56 is a conventional 1-bit DAC. DAC 56 is constructed according to conventional techniques, and generates an. analog signal corresponding to the digital signal applied to its input by ΣΔ modulator 54.

Figure 7:
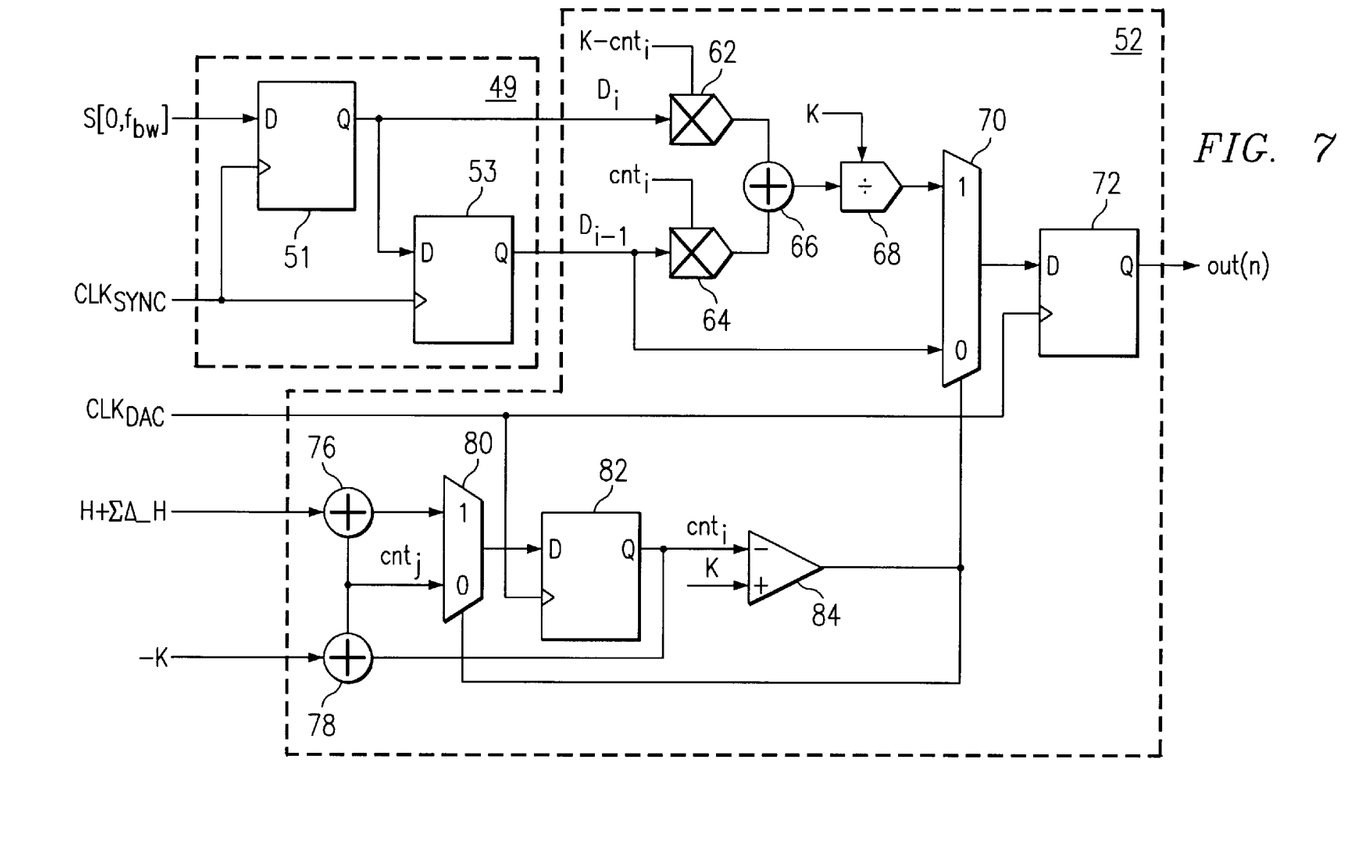
FIG. 7 is an electrical diagram, in block and schematic form, of a sampling latch and digital filter in the DAC of FIG. 5 according to the preferred embodiment of the invention.

According to this embodiment of the invention, as noted above, ΣΔ modulator 54 and DAC 56 (along with digital filter 52 ) are clocked by a relatively low frequency clock. As shown in FIG. 7, frequency divider 53 receives wireless clock WCLK, and divides it in frequency to generate clock signal $CLK_{DAC}$ at the frequency at which digital filter 52, ΣΔ modulator 54, and DAC 56 are to be clocked. This frequency is determined by the operating characteristics of DAC 58, and may be significantly lower than a conventional oversampling frequency, such as in the example as described above relative to FIG. 3. As a result, the complexity and power consumption of digital filter 52, ΣΔ modulator 54, and DAC 56 can be kept modest, while still providing high fidelity in the output analog signal s(t) produced by DAC 56. In particular, the audio noise due to oversampling jitter is minimized, considering that the virtual oversampling effected by second ΣΔ modulator 48 and adder 55 can be set to a high multiple, without requiring generation and use of a high frequency clock signal.

Referring now to FIG. 7, the functional arrangement of sampling latch 49 and digital filter 52 in processing the information provided by adder 55 with in combination with the sampled version of input S(n), and according to this preferred embodiment of the invention, will now be described in detail.

As shown in FIG. 7, sampling latch 49 according to this embodiment of the invention is realized by two latches 51, 53, each of which is clocked by clock signal $CLK_{SYNC}$ that is generated by dual divider 47 under the control of first ΣΔ modulator 46. Latch 51 is a D-type flip-flop that is clocked by clock signal $CLK_{SYNC}$ and that receives input signal S at its D input. The Q output is applied to the D input of latch 53, which is also a D-type flip-flop that is clocked by clock signal $CLK_{SYNC}$. In this manner, latch 51 stores and presents sample $D_i$, which is the most recent sample of input signal S, while latch 53 stores and presents previous sample $D_{i-1}$ of input signal S, taken one period of clock signal $CLK_{SYNC}$ prior to sample $D_i$. These two samples $D_i$, $D_{i-1}$ are presented to digital filter 52, specifically to multipliers 62, 64, respectively.

Multiplier 62 multiplies the value of most recent input sample $D_i$ by the difference between a decimation. ratio K and the current value $cnt_i$ of a counter, and presents the product to an input of adder 66. Multiplier 66 multiplies the value of next previous input sample $D_{i-1}$ by the counter value $cnt_i$, and presents its product to another input of adder 66. The sum generated by adder 66 is applied as the dividend to divider 68, which divides this sum by decimation ratio K.

Decimation ratio K is the effective oversampling multiple between the virtual oversampled input signal and the desired output signal from digital filter 52. As noted above, in conventional oversampled DACs, the input signal is oversampled by a large multiple, such as on the order of 64:1 or 128:1. According to this embodiment of the invention digital filter 52 operates upon a much lower frequency datastream (i.e., at frequency $f_{DAC}$ of clock signal $CLKD_{DAC}$) but with the same information as though the signal were oversampled by a large multiple. In this embodiment of the invention, decimation ratio K relates the virtual oversampling frequency $f_{HF}$ to frequency $f_{DAC}$ at which digital filter 52 operates:

$$f_{DAC} = \frac{1}{K} f_{HF}$$

As such, decimation ratio K corresponds to the average number of samples of the sampled datastream that would be converted to analog within each cycle of clock signal $CLK_{DAC}$. Decimation ratio K is preferably a programmable value stored in a register, for example by DSP 42 or other programmable circuitry, and corresponds to the multiple by way of which decimation of the virtual oversampled signal is to be carried out by digital filter 52. For example, a decimation ratio K of 20 may be used to provide a virtual oversampling frequency $f_{HF}$ of 52.0 MHz while permitting clock signal $CLK_{DAC}$ to have a frequency $f_{DAC}$ of 2.6 MHz.

The virtual oversampling frequency $f_{HF}$ is related to the sampling frequency $f_{SYNC}$ of clock signal $CLK_{SYNC}$, which corresponds to the input sampling rate, by:

$$2f_{bw} = f_{SYNC} = \frac{1}{H + \frac{NH}{DH}} f_{HF}$$

In this example, where the input sampling rate is 44.1 kHz and virtal oversampling frequency $f_{HF}$ is 52.0 MHz, the virtual oversampling ratio $$H + \frac{NH}{DH}$$

will be 1179.14.

The output of divider 68 is applied to one input of multiplexer 70. The value of next previous input sample $D_i$ from the Q output of latch 53 from sampling latch 49 is applied to a second input of multiplexer 70. As will be described in further detail below, multiplexer 70 is controlled by the output of comparator 84. Multiplexer 70 selects one of its inputs, and presents this selected input to the D input of latch 72, which is a D-type flip-flop clocked by clock signal $CLK_{DAC}$. The Q output of latch 72 presents the output signal out(n), which is a digital datastream (e.g., sixteen bits in width) that is forwarded to ΣΔ modulator 54 as shown in FIG. 5.

The selection signal generated by comparator 84 is based on the virtual oversample number H+ΣΔH, produced by adder 55 (FIG. 5). This value H+ΣΔH from adder 55 is applied to one input of adder 76, and is summed with a feedback value $cnt_j$ to produce an output that is applied to one input of multiplexer 80. The second input to adder 76 is based on a current value $cnt_i$ of a counter. This value $cnt_i$ is generated by latch 82, and is applied to one input to adder 78. Adder 78 receives the negative of decimation ratio K at a second input, and generates the difference between decimation ratio K and counter value $cnt_i$, producing potential updated counter value $cnt_j$. This potential updated counter value $cnt_j$ is the feedback value applied to adder 76, and is summed with oversample number H+ΣΔH by adder 76 and applied to multiplexer 80. Potential updated counter value $cnt_j$ is also applied to a second input to multiplexer 80. Multiplexer 80 is controlled by the output of comparator 84, and selects one of its inputs for application to the D input of latch 82, in response to the output of comparator 84. Latch 82 is a D-type flip-flop, clocked by clock signal $CLK_{DAC}$, and has its Q output connected to the inverting input of comparator 84. The Q output of latch 82, as noted above, is the counter value $cnt_i$ used by multipliers 62, 64, as well as by adder 78. Decimation ratio K is applied to the non-inverting input of comparator 84, and thus comparator 84 compares the current counter value $cnt_i$ to decimation ratio K.

Figures 8A, 8B:
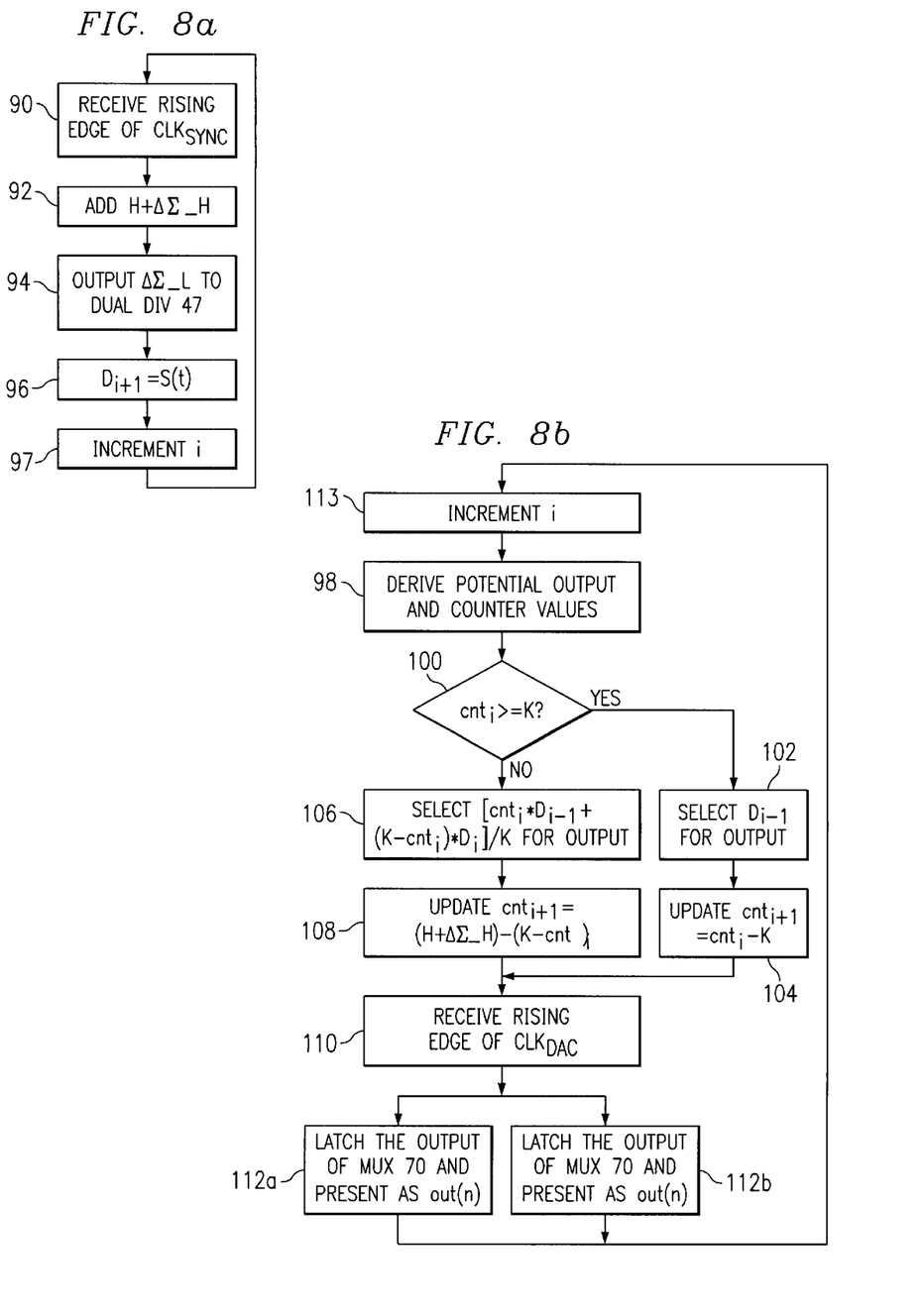
FIGS. 8a and 8b are flow diagram illustrating the operation of sigma-delta modulators and the digital filter in the DAC of FIG. 5 according to the preferred embodiment of the invention.

Referring now to FIG. 8a, the operation of ΣΔ modulators 46, 48, and sampling latch 49, in response to clock signal $CLK_{SYNC}$ will now be described. As shown in FIG. 8a, a rising edge of clock signal $CLK_{SYNC}$ is received by modulators 46, 48, and by latch 49. This clock edge initiates process 92, in which ΣΔ modulator 48 generates the next instance of its output ΣΔH. Output ΣΔH is either a "0" or a "1", and is added to value H by adder 55 as described above. Process 94 is also performed responsive to this clock edge, in which ΣΔ modulator 46 issues the next instance of its output ΣΔL ("0" or "1"), which is applied to dual divider 47 to control its frequency division in the generation of the next cycle of clock signal $CLK_{SYNC}$. In process 96, latch 51 samples input signal S(t) at the rising edge of clock signal $CLK_{SYNC}$. This sampled value becomes the most recent sample $D_i$, while the previous contents of latch 53 are stored in latch 51 and become next previous sample $D_{i-1}$. Considering that processes 92, 94, 96 are performed by different functions (namely ΣΔ modulator 48, ΣΔ modulator 46, and latch 49, respectively), these processes 92, 94, 96 may be performed in any order, or are preferably performed in parallel by these parallel structures. Index i is then incremented (process 97), in preparation for the next rising edge of clock signal $CLK_{SYNC}$, as generated by dual divider 47 (in response to the result of process 94).

Referring now to FIG. 8b in combination with FIG. 7, the operation of digital filter 52 according to this embodiment of the invention will now be described. As evident from FIG. 7, digital filter 52 is controlled by clock signal $CLK_{DAC}$. In this example, this clock signal $CLK_{DAC}$ controls the storing of output and counter values that were generated by digital filter 52 in response to the new input signal samples D. In process 98 of FIG. 8b, digital filter 52 generates these certain output and counter values from the current values in the system, as will now be described.

As discussed above relative to FIG. 8a, input signal values $D_{i-1}$, $D_i$ were updated by latches 51, 53 in sampling latch 49. In process 98, next previous signal value $D_i$ is applied to one input of multiplexer 70. In addition, multiplier 64 multiplies next previous signal value $D_{i-1}$ by counter value $cnt_i$, and the product is applied to adder 66. Multiplier 62 multiplies most recent signal value $D_i$ by the difference between decimation ratio K and the current counter value $cnt_i$, and applies this product to adder 66. Divider 68 divides the sum from adder 66 by decimation ratio K, and the quotient is forwarded to a second input of multiplexer 70 to await selection. In this process 98, therefore, digital filter 52 generates two potential output values from the most recent signal input samples $D_{i-1}$, $D_i$, and from the decimation ratio K and the current value of counter $cnt_i$.

Also in process 98, and in parallel with the generation of the potential output values, adder 78 derives potential counter value $cnt_j$ from the difference between current counter value $cnt_i$ and decimation ratio K, and applies this value $cnt_j$ to one input of multiplexer 80. Adder 76 adds this potential counter value $cnt_j$ to the current output H+ΣΔH from adder 55, and presents this sum, as another potential counter value, to another input of multiplexer 80.

Following process 98, digital filter 52 performs decision 100, in which the current counter value $cnt_i$ is compared to decimation ratio K. As shown in FIG. 7, this comparison is performed by comparator 84, which produces a digital value indicating with a "1" that counter value $cnt_i$ is greater than or equal to decimation ratio K, and with a "0" that counter value $cnt_i$ is less than decimation ratio K. Each of multiplexers 70, 80 are controlled by the output of comparator 84, to perform the processes 102, 104, or 106, 108, according to the result of decision 100 as performed by comparator 84.

If current counter value $cnt_i$ is greater than or equal to decimation ratio K (decision 100 is YES), the output of comparator 84 is a logic "0", which controls multiplexers 70, 80 to perform processes 102, 104, respectively. In process 102, multiplexer 70 selects the next previous input sample $D_{i-1}$, for application to the D input of latch 72. In process 104, comparator 80 selects potential counter value $cnt_j$, namely the difference between the current counter value $cnt_i$ and decimation ratio K, for application to the D input of latch 82. Control then passes to process 110.

On the other hand, if current counter value $cnt_i$ is less than decimation ratio K (decision 100 is NO), the output of comparator 84 is a logic "1", which controls multiplexers 70, 80 to perform processes 106 108, respectively. In process 106, multiplexer 70 selects the output of divider 68 for application to the D input of latch 72. As described above, divider 68 presents a digital word corresponding to the value:

$$\frac{cnt_i * D_{i-1} + (K - cnt_i) * D_i}{K}$$

This value is effectively an interpolation between the two most recent, input signal samples $D_{i-1}$, $D_i$, where the interpolation between the samples $D_{i-1}$, $D_i$ is weighted by the difference between current count value $cnt_i$ and decimation ratio K. In other words, if current counter value $cnt_i$ is close to decimation ratio K, the interpolation is weighted more heavily toward the next previous input signal sample $D_{i-1}$. This interpolation approaches the limit of current count value $cnt_i$ exceeding decimation ratio K, in which case comparator 84 selects sample $D_{i-1}$ from the output of latch 53 for application to latch 72. Conversely, if current counter value $cnt_i$ is much less than decimation ratio K, the interpolation is weighted more heavily-toward the most recent input signal sample $D_i$. This conditional interpolation carries out the filtering and noise shaping according to this exemplary embodiment of the invention.

In process 108, comparator 84 controls multiplexer 80 to select the output of adder 76 for application to latch 82, to become the next updated counter value $cnt_{i+1}$. As discussed above and as shown in FIG. 8b, this potential counter value is:

$$(H+\Delta\Sigma\_H)-(K-cnt_i)$$

This value, in effect, sets the counter value $cnt_{i+1}$ to the number of virtual oversampled pulses of the incoming data value, less the residual difference between the current count value $cnt_i$ and the decimation ratio K. Control then passes to process 110.

In process 110, digital filter 52 receives a rising edge of clock signal $CLK_{DAC}$. This rising edge of clock signal $CLK_{DAC}$ initiates process 112a, in which output latch 72 is clocked to store the digital value presented at its D input by multiplexer 70, as selected by comparator 84 in decision 100. Latch 72 then presents this value, at its Q output, to sigma-delta modulator 54 (FIG. 5), as a sample of output signal out(n).

Process 112b is also initiated by this rising edge of clock signal $CLK_{DAC}$. As shown in FIG. 8b, processes 112a, 112b can be considered as being performed in parallel with one another. In process 142b, latch 82 is clocked to store the output of multiplexer 80, as the next counter value $cnt_{i+1}$. As noted above, multiplexer 70 selects either the output of adder 78 or the output of adder 76, depending on the result of decision 100 as performed by comparator 84.

Following processes 112a, 112b, the operation of digital filter 52 is then repeated for the next input signal sample value. Index i is incremented, by process 113, following which the next instance of process 98 derives the next potential output and counter values.

The effect of the operation of digital filter 52, as described above relative to FIGS. 7 and 8b, is to generate a digital datastream out(n) that corresponds to the equivalent datastream that would be produced in a conventional oversampled DAC, including oversampling, sinc filtering, and decimation. Digital filter 52 performs this operation based upon an input signal datastream S that is sampled, by sampling latch 49, at a relatively low frequency $f_{SYNC}$ of a clock signal $CLK_{SYNC}$ generated from wireless clock WCLK, and based upon the output of a ΣΔ modulator that generates the desired oversampling multiple (H+ΔΣ_H).

As described above, digital filter 52 filters the input signal S and forms the digital datastream out(n), according to the desired oversampling multiple and according to a decimation ratio (K), by maintaining a counter ($cnt_t$) that corresponds to the position within a sample at which the decimation is taking place. If the value of this counter is below the decimation ratio or negative, the oversample being decimated is near a transition point between samples. The output value is then generated as a weighted average of the previous and most recent samples, according to position of the selected virtual oversample relative to the transition point, and the counter is updated to the desired oversampling multiple less a residual difference between its previous value and the decimation ratio. If the value of the counter is above the decimation ratio, the decimation is taking place well within the duration of the sample, so the output value is simply selected to be the previous sample value, and the updated counter value is set to its previous value less the decimation ratio.

It is therefore contemplated that this filter approach generates an output datastream that effectively matches that of high-speed oversampled DACs, but without requiring the generation and use of the high frequency clocks necessary in such approaches. In addition, it is contemplated that this filter incorporates the necessary sinc (sinx/x) filtering for decimation, effectively attenuating power at multiples of the output frequency. Indeed, it is contemplated that the virtual oversampling provided by this invention can provide an output datastream suitable for D/A conversion that exceeds, in fidelity, that which can be achieved by conventional actual oversampling achievable by the same technology.

Figure 9A:
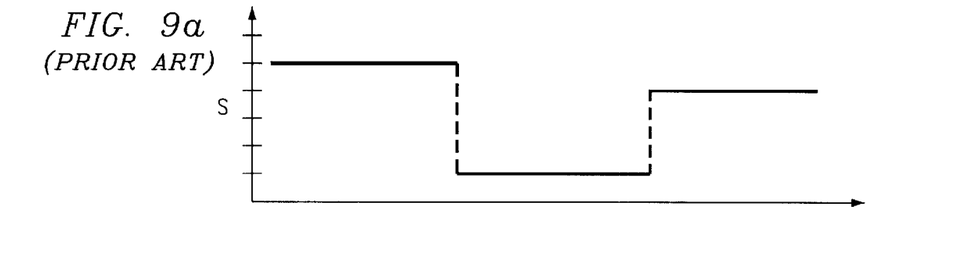
FIGS. 9a through 9d are timing diagrams illustrating an example of the operation of a conventional oversampled DAC.
Figure 9B:
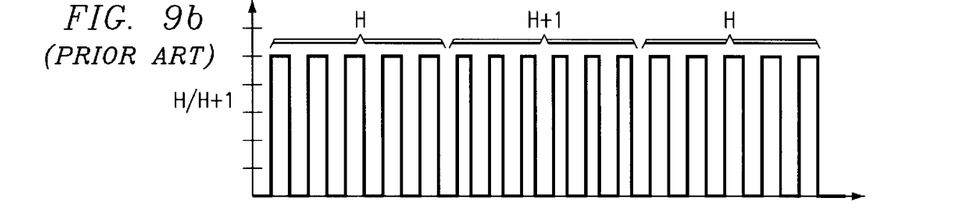
Figure 9C:
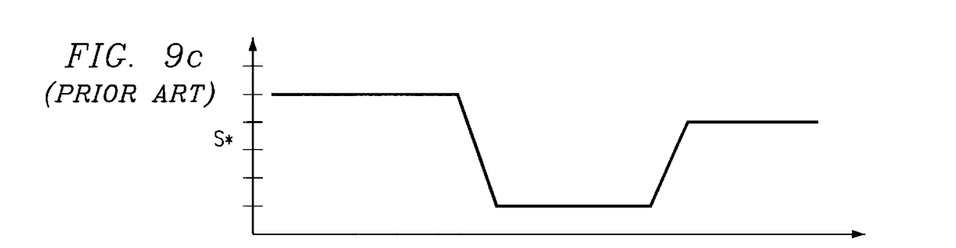
Figure 9D:
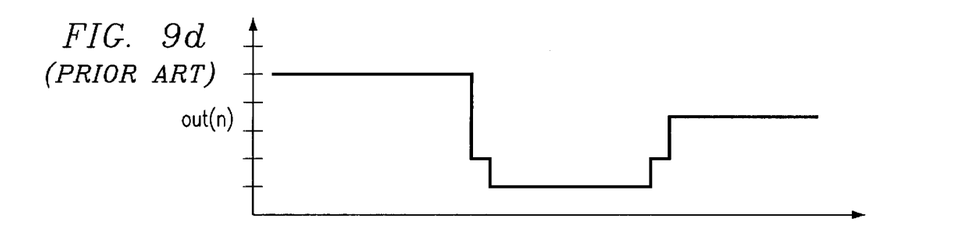
Figure 10A:
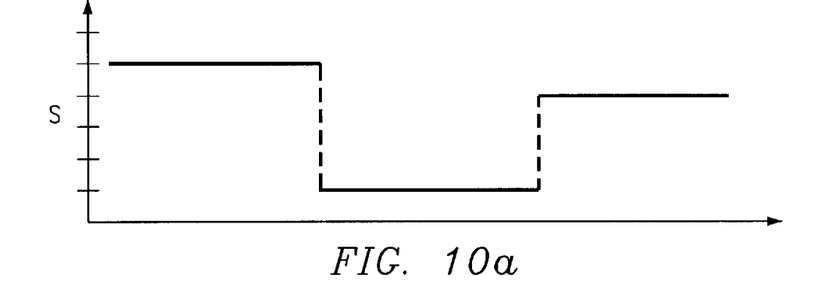
FIGS. 10a through 10c are timing diagrams illustrating an example of the operation of a DAC according to the preferred embodiment of the invention.
Figure 10B:
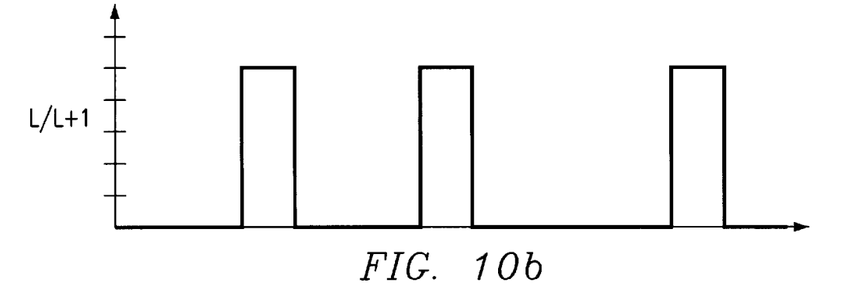
Figure 10C:
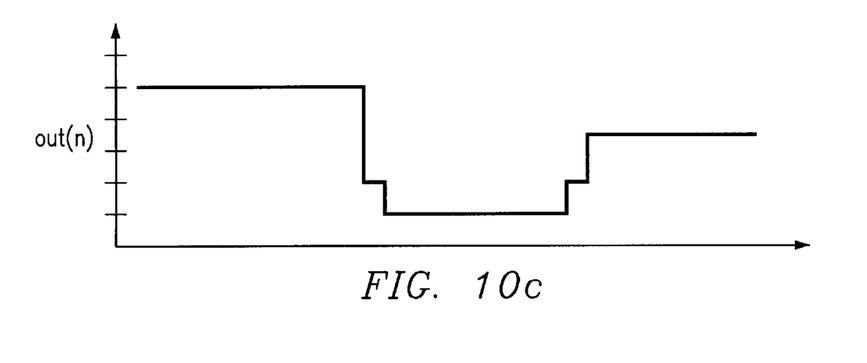

Referring now to FIGS. 10a through 10c, in comparison with FIGS. 9a through 9d, the effect of digital filter 52 according to the preferred embodiment of the invention will now be described in detail. FIGS. 9a through 9d illustrate the operation of a conventional oversampled DAC, such as shown in FIG. 3, receiving input signal S as shown in FIG. 9a. FIG. 9b illustrates the H or H+1 oversampling clock pulses, as applied to input signal S by a dual frequency divider such as dual divider 38 of FIG. 3. In the simplified example of FIG. 9b, either H=5 or H+1=6 samples are taken of each input signal S level; in practice, the oversampling multiple will be on the order of 128 or greater. In either case (H or H+1), the oversampling frequency is relatively high, as compared to the frequency of the input signal S. FIG. 9c illustrates a sinc (sinx/x) filtered sampled signal S. FIG. 9d illustrates the sampled and filtered signal after decimation, which is a reconstructed signal produced by decimation.

FIGS. 10a through 10c illustrate an example of the operation of digital filter 52 according to this preferred embodiment of the invention. Input signal S is again shown in FIG. 10a, and is the same as shown in FIG. 9a. FIG. 10b illustrates the relatively low frequency sampling carried out by sampling latch 49 according to this embodiment of the invention, with the sampling clock $CLK_{SYNC}$ generated by dividing wireless clock WCLK by L or L+1, depending upon the division performed by dual divider 47. Digital filter 52 according to this embodiment of the invention, performing the weighted interpolation described above, directly generates the reconstructed signal of FIG. 10c, which is effectively identical to that shown in FIG. 9d for the conventional oversampling approach. Accordingly, the preferred embodiment of the invention provides a high fidelity reconstructed signal for digital-to-analog conversion, without requiring the high frequency :clock and circuitry that is necessary according to conventional circuits.

Referring back to FIG. 5, output datastream out(n) from digital filter 52 is applied to sigma-delta modulator 54. Modulator 54 is constructed in the conventional manner, and produces an output signal that is of lower bit resolution (for example from one to three bits in width) than is output datastream out(n) having, for example, sixteen bit words. Modulator 54, in this example, is clocked by clock signal $CLK_{DAC}$, which is the same clock that controls digital filter 52 and DAC 58. The output of modulator 54 is applied DAC 58, which is of conventional construction, and which presents output analog signal S(t). This signal is then amplified as appropriate to drive speaker SPK (FIG. 4).

According to this invention, an oversampling digital-to-analog converter is provided that can easily process input digital signals at a wide range of frequencies, using a system clock that can also be at any one of a number of frequencies. This DAC is particularly attractive for the conversion of audio output signals in multimedia-capable multi-mode wireless telephones, because of the wide range of input audio signal sources, and because the system frequency depends upon the particular one of several wireless transmission modes being used. Flexibility in the determination of the frequencies used and generated can be easily controlled by the programmability of multiples to sigma-delta modulators in the DAC, and because the digital filtering, modulation, and D/A conversion can be controlled using relatively low frequency clocks for the level of oversampling performance that is achieved.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A digital-to-analog converter, comprising:
   a dual frequency divider, for dividing a system clock signal by a divisor selected from a pair of adjacent integers, to produce a sampling clock;
   a first sigma-delta modulator, for selecting the divisor for the dual frequency divider;
   a second sigma-delta modulator, for selecting an oversampling multiple from a pair of adjacent integers;
   a sampling latch, for sampling an input digital datastream synchronously with the sampling clock;
   a digital filter, having an input receiving the sampled input digital datastream and an input receiving the selected oversampling multiple in the form of a digital word, for generating a reconstructed datastream corresponding to the input digital datastream; and
   a digital-to-analog converter circuitry for producing an analog signal from the reconstructed datastream.

2. The converter of claim 1, wherein the digital-to-analog converter circuitry comprises:
   a third sigma-delta modulator, for producing a lower-resolution modulated signal from the reconstructed datastream; and
   a digital-to-analog converter, for producing the analog signal form the lower-resolution modulated signal.

3. The converter of claim 1, further comprising:
a frequency divider, for producing a DAC clock having a frequency divided down from the frequency a system clock;
wherein the DAC clock is coupled to the digital filter and to the digital-to-analog converter circuitry.

4. The converter of claim 3, wherein the input digital datastream has a bandwidth;
wherein the sampling clock has an average frequency at approximately the sampling frequency of the input digital datastream.

5. The converter of claim 1, wherein the digital filter comprises:
circuitry for comparing a count value with a decimation ratio;
interpolation circuitry, for producing a weighted interpolation between a most recent value of the sampled input digital datastream and a previous value of the sampled input digital datastream;
a first multiplexer, for selecting either an interpolated value of the sampled input digital datastream from the interpolation circuitry or a selected value of the sampled input digital datastream responsive to the comparing circuitry, as an output value from the digital filter; and
circuitry for updating the count value responsive to the comparing circuitry.

6. The converter of claim 5, wherein the updating circuitry comprises:
a first adder for deriving a difference between the decimation value and the count value;
a second adder for adding the difference from the first adder to a current value of the oversampling multiple from the second sigma-delta modulator; and
a second multiplexer, for selecting the output of the first adder or the output of the second adder to produce an updated count value responsive to the comparing step.

7. The converter of claim 6, wherein the digital filter further comprises:
an output latch, clocked by the DAC clock, for storing the selected output of the first multiplexer; and
a counter latch, clocked by the DAC clock, for storing the selected output of of the second multiplexer.

8. The converter of claim 5, wherein the digital filter further comprises:
an output latch, clocked by the DAC clock, for storing the selected output of the first multiplexer.

9. The converter of claim 5, wherein the sampling latch comprises:
a first latch, clocked by the sampling clock, for storing the most recent value of the input digital datastream; and
a second latch, clocked by the sampling clock, having an input coupled to an output of the first latch, for storing the previous value of the input digital datastream.

10. The converter of claim 1, wherein the sampling latch comprises:
a first latch, clocked by the sampling clock, for storing a most recent value of the input digital datastream; and
a second latch, clocked by the sampling clock, having an input coupled to an output of the first latch, for storing a previous value of the input digital datastream.

11. The converter of claim 1, further comprising a digital signal processor for performing the digital filter.

12. A method of converting an input digital datastream, having a bandwidth, to an analog signal, comprising the steps of:

controlling a dual frequency divider to divide a system clock signal by a divisor selected from an adjacent pair of integers, to produce a sampling clock having an average frequency divided from the frequency of the system clock by a value between the pair of integers;
sampling the input digital datastream responsive to the sampling clock;
generating a sequence of digital words corresponding to oversampling multiples selected from an adjacent pair of integers;
reconstructing a digital datastream from the sampled input digital datastream and the sequence of oversampling multiples; and
converting the reconstructed digital datastream to an analog signal.

13. The method of claim 12, wherein the step of controlling the dual frequency divider comprises:
performing sigma-delta modulation synchronously with the sampling clock to produce a sequence of control bits; and
applying the control bits to the dual frequency divider.

14. The method of claim 13, wherein the step of generating the sequence of digital words corresponding to oversampling multiples comprises:
performing sigma-delta modulation synchronously with the sampling clock to produce a sequence of increment bits; and
adding the increment bits to a base oversampling multiple to produce the digital words.

15. The method of claim 12, wherein the reconstructing step comprises:
deriving a weighted interpolation between a most recent value of the sampled input digital datastream and a previous value of the sampled input digital datastream;
comparing a count value with a decimation ratio;
selecting, for an output value, either the weighted interpolation or a selected value of the sampled input digital datastream responsive to the comparing step; and
updating the count value responsive to the comparing step.

16. The method of claim 15, wherein the updating step comprises:
deriving a difference between the decimation value and the count value;
adding the difference to a current value of the oversampling multiple; and
responsive to the comparing step, selecting the difference or the result of the adding step as an updated count value.

17. A wireless telephone, comprising:
an RF transceiver, for receiving and transmitting RF signals from and to a wireless network;
digital signal processing circuitry, coupled to the RF transceiver, for performing digital signal processing operations upon signals to be transmitted and received signals;
a speaker; and
audio input/output circuitry, coupled to the digital signal processing circuitry, for driving the speaker with an analog audio signal corresponding to digital baseband audio signals produced by the digital signal processing circuitry, the audio input/output circuitry including a digital-to-analog conversion function that comprises:
a dual frequency divider, for dividing a system clock signal by a divisor selected from a pair of adjacent integers, to produce a sampling clock;

a first sigma-delta modulator, for selecting the divisor for the dual frequency divider;

a second sigma-delta modulator, for selecting an oversampling multiple from a pair of adjacent integers;

a sampling latch, for sampling an input digital baseband datastream synchronously with the sampling clock;

a digital filter, having an input receiving the sampled input digital baseband datastream and an input receiving the selected oversampling multiple in the form of a digital word, for generating a reconstructed datastream corresponding to the input digital baseband datastream; and digital-to-analog converter circuitry for producing an analog signal from the reconstructed datastream.

18. The telephone of claim 17, wherein the digital filter is executed by the digital signal processing circuitry.

19. The telephone of claim 17, wherein the digital-to-analog conversion function further comprises:

a frequency divider, for producing a DAC clock having a frequency divided down from the frequency of a system clock;

wherein the DAC clock is coupled to the digital filter and to the digital-to-analog converter circuitry.

20. The telephone of claim 17, wherein the input digital datastream has a bandwidth;

wherein the sampling clock has an average frequency equal to the sampling frequency of the input digital datastream.

21. The telephone of claim 17, wherein the digital filter comprises:

circuitry for comparing a count value with a decimation ratio;

interpolation circuitry, for producing a weighted interpolation between a most recent value of the sampled input digital baseband datastream and a previous value of the sampled input digital baseband datastream;

a first multiplexer, for selecting either an interpolated value of the sampled input digital baseband datastream from the interpolation circuitry or a selected value of the sampled input digital baseband datastream responsive to the comparing circuitry, as an output value from the digital filter; and circuitry for updating the count value responsive to the comparing circuitry.

22. The telephone of claim 21, wherein the updating circuitry comprises:

a first adder for deriving a difference between the decimation value and the count value;

a second adder for adding the difference from the first adder to a current value of the oversampling multiple from the second sigma-delta modulator; and a second multiplexer, for selecting the output of the first adder or the output of the second adder to produce an updated count value responsive to the comparing step;

and wherein the digital filter further comprises:

an output latch, clocked by the DAC clock, for storing the selected output of the first multiplexer;

a counter latch, clocked by the DAC clock, for storing the selected output of the second multiplexer; and an output latch, clocked by the DAC clock, for storing the selected output of the first multiplexer.

23. The telephone of claim 17, wherein the sampling latch comprises:

a first latch, clocked by the sampling clock, for storing the most recent value of the input digital baseband datastream; and a second latch, clocked by the sampling clock, having an input coupled to an output of the first latch, for storing the previous value of the input digital baseband datastream.

* * * * *